United States Patent [19]
Boddie et al.

[11] Patent Number: 5,802,387
[45] Date of Patent: Sep. 1, 1998

[54] EFFICIENT DATA TRANSFER IN A DIGITAL SIGNAL PROCESSOR

[75] Inventors: James Riley Boddie, Hanover Township; Alan Joel Greenberger, South Whitehall Township, both of Pa.

[73] Assignee: Lucent Technologies Inc., Murray Hill, N.J.

[21] Appl. No.: 777,337

[22] Filed: Dec. 27, 1996

[51] Int. Cl.⁶ .................................................. G06F 13/40
[52] U.S. Cl. ...................... 395/800.42; 395/310; 711/169
[58] Field of Search ........................... 395/800.42, 851, 395/287, 310; 711/169

[56] References Cited

U.S. PATENT DOCUMENTS

| | | | |
|---|---|---|---|
| 4,422,214 | 12/1983 | Guttay | 395/800.42 |
| 4,494,222 | 1/1985 | White et al. | 365/222 |
| 4,718,057 | 1/1988 | Venkitakrishnan et al. | 370/229 |
| 4,760,517 | 7/1988 | Miller et al. | 395/800.42 |
| 4,825,356 | 4/1989 | Lenoski | 345/381 |
| 5,504,916 | 4/1996 | Murakami et al. | |
| 5,513,374 | 4/1996 | Baji | |

*Primary Examiner*—William M. Treat

[57] ABSTRACT

An integrated circuit including a circuit for improved efficiency of internal data transfer comprises: a processor core having a buffer memory; a random access memory having a read and write cycle time of a one clock cycle, the random access memory comprising a memory array with a predetermined word width and a data latch coupled to the memory array; a bi-directional data bus coupling the processor core to the random access memory, the bi-directional data bus having a data width which is a multiple of at least one times the predetermined word width; and, a signal circuit coupled to the data latch wherein the data latch is responsive to the signal circuit to latch data from the bi-directional data bus prior to writing the data to the memory array, wherein alternately reading two consecutive data words and writing two consecutive words occurs on an average in the clock cycle.

18 Claims, 7 Drawing Sheets

EFFICIENT DATA TRANSFER IN A DIGITAL SIGNAL PROCESSOR

FIELD OF THE INVENTION

This invention relates generally to digital circuits, and more particularly to a scheme for optimizing the performance of such digital circuits.

BACKGROUND OF THE INVENTION

Digital circuits including microprocessors, microcontrollers and digital signal processors (DSP) are well-known devices used in many consumer, non-consumer, and wireless applications today. The digital signal processor has been developed to manipulate analog signals in digital form, and can be utilized in image processing, telecommunications, audio processing, anti-skid brakes, multimedia presentations and other areas. These applications require high speed real time processing and involve a large number of digital calculations.

Figure 1:
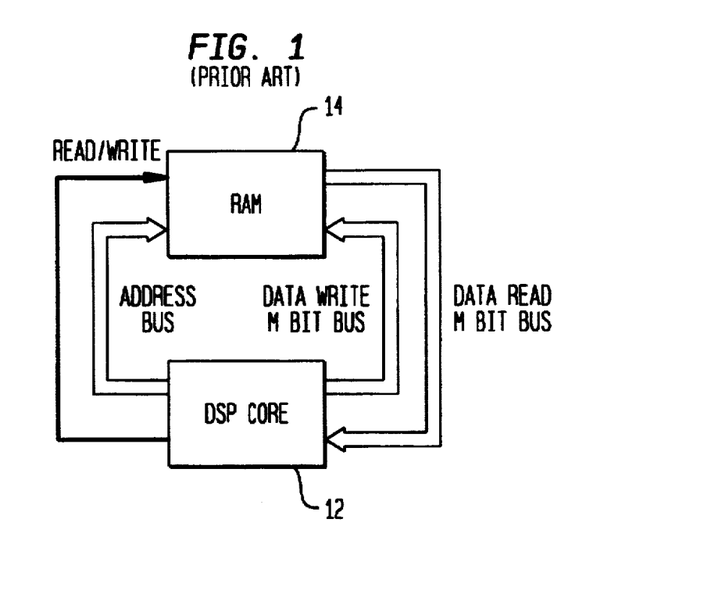
FIG. 1 shows a typical prior art connection between the Core and RAM of a DSP.

FIG. 1 shows a typical configuration for the connection of a DSP Core (Core) 12 with an on-chip RAM memory (RAM) 14. The Core 12 sends a memory address to a RAM 14. In some caese, some of the memory address bits are separately decoded, and an enable signal is sent to the memory. It also sends a signal indicating whether the transaction should be a read or a write. For a write transaction, the Core 12 sends data to the RAM 14 on a data write bus. For a read transaction, the RAM 14 sends data to the Core 12 on a data read bus. In the typical prior art, the read and write buses each have the M bit width of a word of data, where that width is typically between 16 and 32 bits for single chip DSPs. There may be some high end microprocessor chips that send multiple words at once.

A frequent transaction in a DSP is the operation on a vector of data. In this mode, a vector of data consisting of a sequence of data words, each comprising elements of the vector, are fetched from the RAM 14. The vector is modified in the Core 12 in some way and the modified vector of data is returned to the RAM 14. For a circuit in the prior state of the art typified in FIG. 1, each memory cycle only allows either the reading or writing of one word. Hence, for a vector of N words, it takes 2N memory cycles in order to read the vector and return the modified vector. However the Core 12 can have the capability of processing one word of data per cycle, which only takes it N cycles. So the Core 12 may be kept unproductive for N of the 2N memory cycles.

Figure 2:
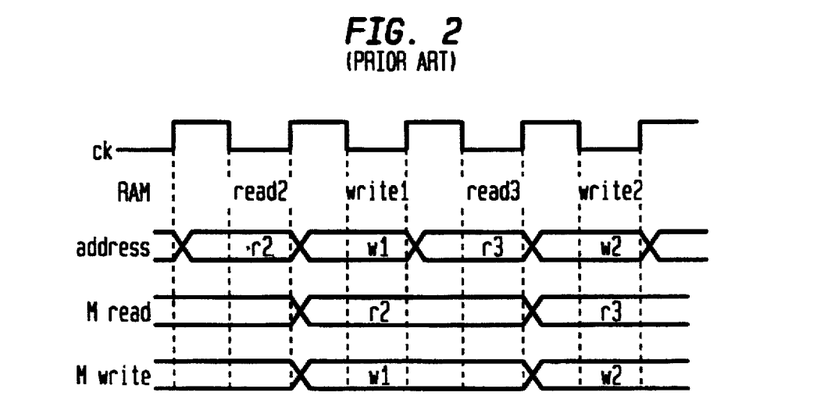
FIG. 2 shows the timing for the typical prior art DSP of FIG. 1.

Referring to FIG. 2 there is shown typical timing for alternately reading and writing the RAM 14. The waveform labeled "ck" represents a clock with a low and a high phase for each memory cycle. In alternate cycles, read or write addresses are sent. In the phase following the transmission of the address, the memory performs either a read or write operation. Notice that the M bits of data to be written are transmitted on the write data bus prior to the write, but the M bits of data read from the RAM are transmitted after the read.

Therefore, there is a need for improved efficiency of data transfer in a DSP between the Core and the RAM.

SUMMARY OF THE INVENTION

In accordance with the present invention, there is provided an integrated circuit including a circuit for improved efficiency of internal data transfer. The integrated circuit comprises: a processor core having a buffer memory; a random access memory having a read and write cycle time of a one clock cycle, the random access memory comprising a memory array with a predetermined word width and a data latch coupled to the memory array; a bi-directional data bus coupling the processor core to the random access memory, the bi-directional data bus having a data width which is a multiple of at least one times the predetermined word width; and, a signal circuit coupled to the data latch wherein the data latch is responsive to the signal circuit to latch data from the bi-directional data bus prior to writing the data to the memory array, wherein alternately reading two consecutive data words and writing two consecutive words occurs on an average in the clock cycle.

BRIEF DESCRIPTION OF THE DRAWINGS

A more complete understanding of the present invention may be obtained from consideration of the following description in conjunction with the drawings in which.

DETAILED DESCRIPTION OF VARIOUS ILLUSTRATIVE EMBODIMENTS

Figure 3:
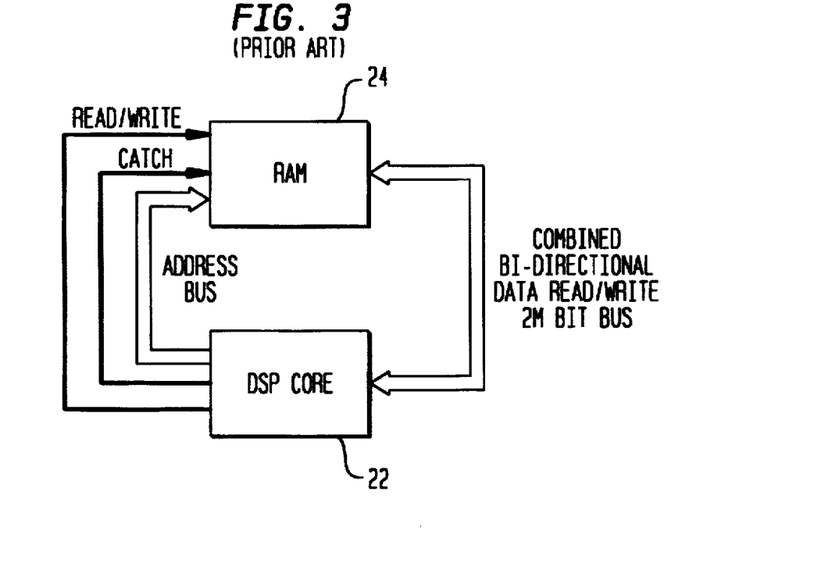
FIG. 3 shows a DSP with combined bi-directional read write data bus.

In a first embodiment of the present invention, a double width transfer provides a factor of two improvement over the prior art method described above. Referring to FIG. 3 there is shown that separate M bit width read and write buses have been combined into a single bi-directional bus of 2M bit width. In this scheme, a vector is processed by alternating read and write cycles of the RAM 24. In one cycle, two words are read and then transmitted on the double wide read/write bus followed by a cycle where two words are written back to the RAM 24. On the average, the RAM 24 reads one word and writes one word per cycle so that with a small buffer memory in the Core 22, the vector only takes N memory cycles to both read and write back and the Core 22 need not be idle.

Referring to FIG. 2 there is indicated a potential collision between use of the double width single bus of FIG. 3 between alternating read and write data. A solution is either to hold the data in the RAM 24 for a cycle or transmit the write data early from the Core 22 and hold it in the RAM 24.

Figure 4:
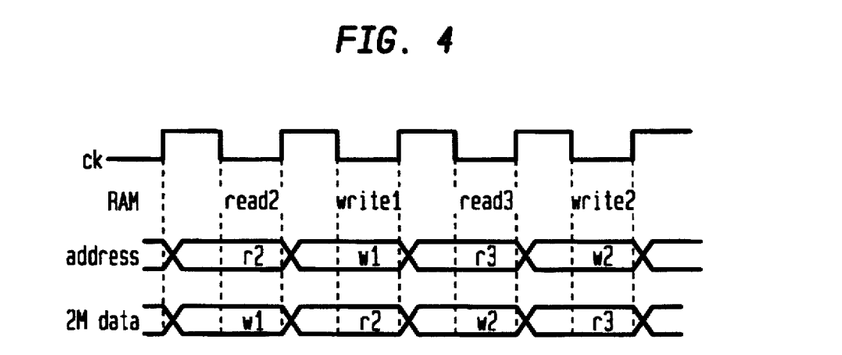
FIG. 4 shows the timing for the DSP of FIG. 3.

The latter scheme is preferable because access time for reading data is more time critical for high performance and there is typically a latch for the incoming data in the RAM 24 that can be used. A "catch" signal has been added in FIG. 3 to signal to the RAM 24 when to latch data in from the combined bi-directional read write data bus. FIG. 4 shows the timing for the single bus of double width shown in FIG. 3.

Figure 5:
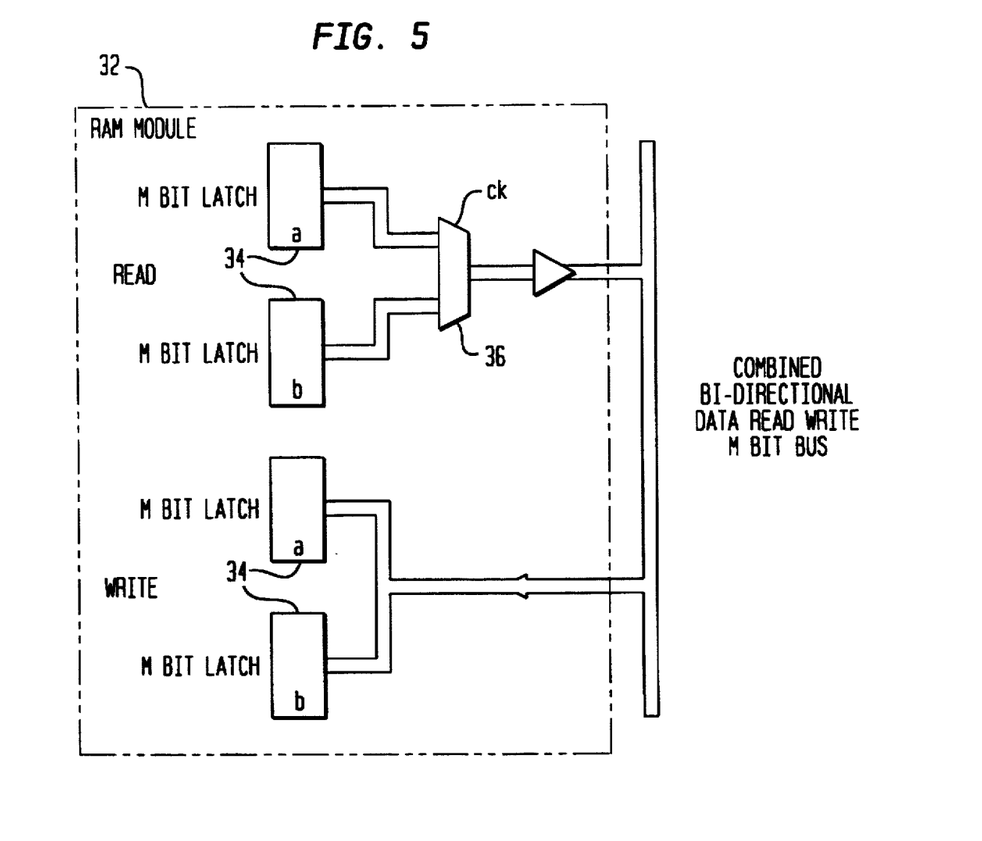
FIG. 5 shows logic inside a memory module interfacing to a combined bi-directional read write data bus.

In a high performance DSP, it typically only requires one phase (half a clock cycle) for the read or write data to propagate on the bus from source to destination. Then for the timing of FIGS. 2 and 4, whenever ck is low, the 2M bits of data bus are unutilized. Referring to FIG. 5, there is shown another embodiment of the present invention, where the bus bandwidth can be recovered and the bus size halved by transfer per phase operation. The combined bi-directional read write data bus has been reduced to M bits wide. Inside the RAM module 32, M bit wide latches 34 and a multiplexer 36 have been added. When two words of data are simultaneously read from the memory array, they are held in two M bit wide latches 34. During the phase following the read, one of the two words is transmitted on the combined bi-directional read write data bus. On the next phase, the multiplexer 36 is switched to allow the other word to be transmitted on the combined bi-directional read write data bus. When a write of two words is desired, one word is transmitted on the combined bi-directional read write data bus during one phase and held in one of the two latches 34 shown. In the following phase the other word is transmitted to the second latch 34. When both words are received the write of two words simultaneously into the RAM array proceeds. Thereby, only an M bit wide data bus is required to both read and write one word per cycle on the average.

Figure 6:
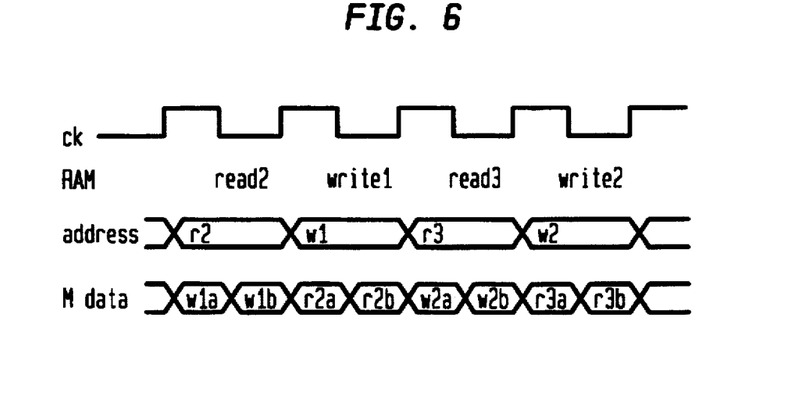
FIG. 6 shows the timing for the DSP of FIG. 5.

Referring to FIG. 6, there is shown the timing associated with the circuitry of FIG. 5 when alternate cycles are used to read and write two words. The M bit wide latches (registers) 34 marked a and b in FIG. 5 correspond with the a and b in the data wave form of FIG. 6.

Current integrated circuit processing techniques make the availability of ever larger numbers of transistors and wires possible on a single chip. This makes practical putting arithmetic means capable of operating on multiple words of data per cycle on a single chip. The present invention provides more effective ways for the transfer of vectors of data to and from a RAM for multiple word per cycle processing.

While the embodiments of the present invention are shown where the Core data processing capability is one data word per cycle, it is equally well suited for higher multiples of data words per cycle. By doubling the width of the combined bi-directional read write data bus shown in FIG. 5, two words per cycle can be fed to the Core and two words per cycle can be returned on the average.

Figure 7:
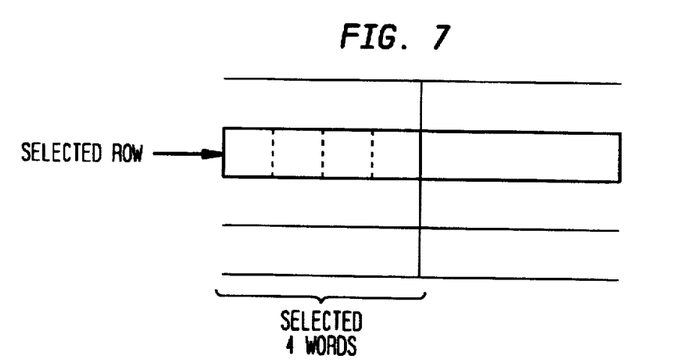
FIG. 7 shows a representation of data words within a RAM.

Inside a RAM module there is a rectangular array of bits arranged in rows and columns. Typically, the number of columns is the number of bits in one word times an integer power of two. In the common single port RAM, all the bits of a word of data reside as elements of a single row in the memory. Each row then holds a power of two number of words. In a typical RAM design, part of the address is decoded to select the row on which a word resides. The remainder of the address is decoded to select which columns of that row are to be read or written. In the demonstrative case, up to four words per cycle are to be read or written. Referring to FIG. 7 there is shown a simplified view of words arranged in a rectangular array inside a RAM. Each small box represents an M bit word. The selected row contains eight words of which column multiplexers select four of the eight for reading or writing. The selected four words are shown shaded.

It is significant to note for the arrangement shown in FIG. 7, that four words at a time are accessible only as groups that are aligned on fixed four word boundaries. However, DSP programs typically have to read and write vectors which may begin or end on any particular address, not necessarily one out of every four that is aligned. An even more complicated case frequently exists in which a circular buffer is created in memory. Each time through the computation, the address of the first word of the vector is incremented so that the required alignment changes dynamically. In order to process multiple words at a time with arbitrary alignment, it is possible to provide a small buffer memory in the Core 22 that can temporarily hold words to be read or written until properly aligned groups are available.

Figure 8:
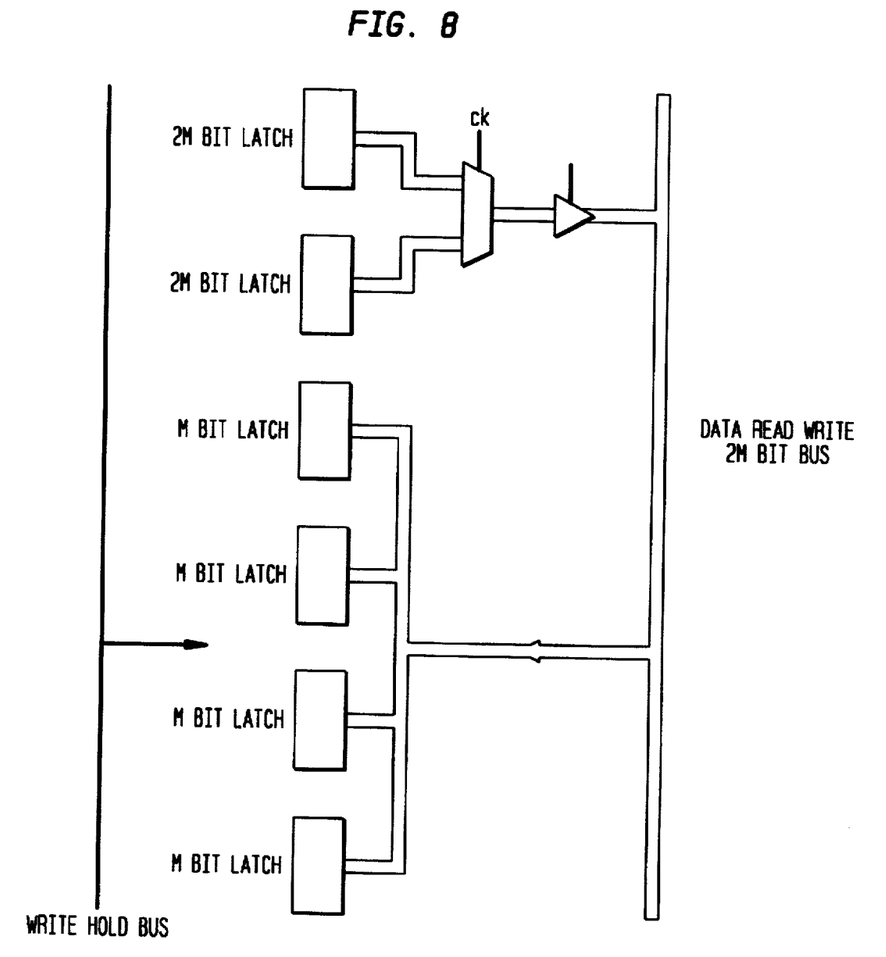
FIG. 8 shows a DSP with a narrow write hold bus and logic inside a memory module interfacing to a combined bi-directional read write data bus.

In a further enhancement of the present invention, there is shown in FIG. 8 how the circuit shown in FIG. 5 can be modified to support the alternate reading and writing of four words per cycle including the ability to write vectors that may begin and end on non-aligned addresses. The combined bidirectional read write data bus is now 2M bits wide supporting the reading or writing of four words per cycle, two per phase.

When a read cycle occurs, four words are read and held in two 2M bit wide latches. The contents of one of these latches is then transmitted to the Core 22 in one phase and the contents of the other latch on the following phase. The Core 22 contains a small buffer memory that aligns the read data. The first time that four words are requested from a misaligned address, an extra read cycle is required before the Core 22 can assemble four contiguous words starting at the non-aligned address from two read cycles.

Referring to the circuit shown in FIG. 8 there is a narrow write hold bus which has been added to replace the "catch" signal of the circuit shown in FIG. 3. The Core 22 drives between one and four words at a maximum rate of two per phase onto the combined bi-directional read write data bus. The Core 22 also issues a write hold command from among those listed in Table 1.

TABLE 1

| Write Hold Command |
|---|
| hold |
| catch1 |
| catch2 |
| catch3 |
| catch4 |

This instructs the logic in the RAM 24, which of the four M bit wide write hold latches are to capture data to be written. After the address is transmitted, the appropriate one to four words are actually written into the RAM array.

Figure 9:
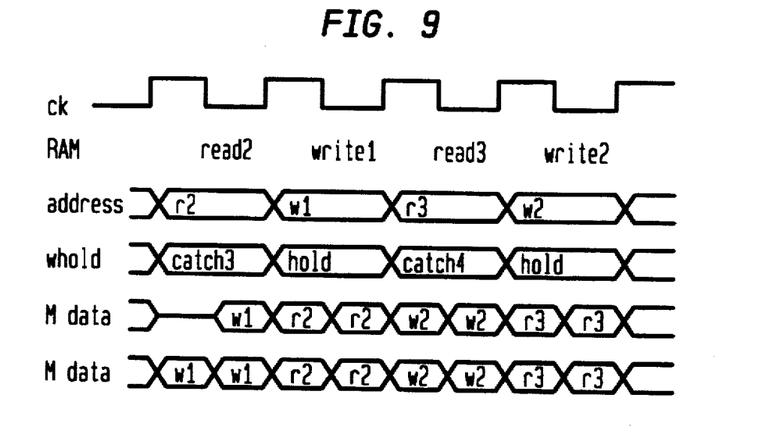
FIG. 9 shows the timing for the circuit of FIG. 8.

Referring to FIG. 9 there is shown a timing diagram of an example of the operation of the circuitry shown in FIG. 8 on a vector beginning on a misaligned address. The address of the first word of the vector is such that only the first three words of the vector reside in a single four word group indicated in FIG. 7. The Core 22 drives only one M bit wide word onto the 2M bit combined bi-directional read write data bus together with a command on the write hold bus that the memory write latches should catch three words. In the next phase the Core drives two words onto the 2M bit combined bi-directional read write data bus. After a read cycle, another write cycle occurs, but this time an entire group of four words may be written. At the end of the vector, a similar situation, not shown, may occur where less than a full four aligned words are written to complete writing the vector. In that case, the Core again drives less than four words in two phases and drives a command on the write hold bus indicating how many words are to be caught. In this way, the circuitry has all the flexibility it needs.

When beginning to read a vector at a rate of more than one word per cycle, the time that it takes to get the first words into the Core 22 depends on the alignment discussed above.

While the embodiments of the present invention are shown where the Core data processing capability is two data words per cycle, it is equally well suited for higher multiples of data words per cycle. In addition, the Core 22 sometimes needs to read only a single scalar word as fast as possible.

Figure 10:
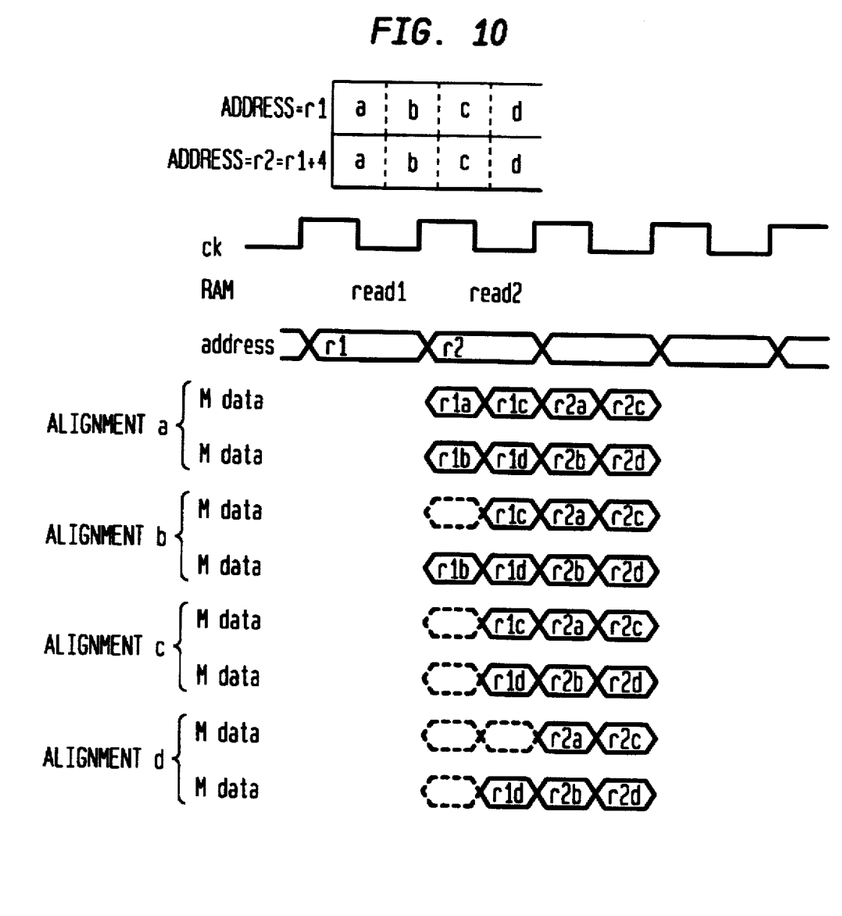
FIG. 10 shows the timing for reading four consecutive words for four different alignments in memory.

Referring to FIG. 10 there is shown two consecutive groups of four aligned words in memory and the corresponding timing. The first word of the first group is pointed to by address r1 and is labeled a. The next three consecutive words are labeled b, c, and d. The first word of the next group of four is pointed to by address r2=r1+4 and is again labeled a for its alignment. The next three consecutive words are again labeled b, c, and d for their alignments. Shown in FIG. 10 is the timing for reading back words to the Core 22 if the first word desired begins on alignment a, b, c, or d. The timing is assumed to be the same as that shown in the embodiment of FIG. 9. It should be noted that if two words are needed by the Core 22, only alignment a can satisfy it in the first phase where ck is high. Furthermore, if only one word is needed, only alignments a and b can satisfy the Core in the first phase.

Figure 11A:
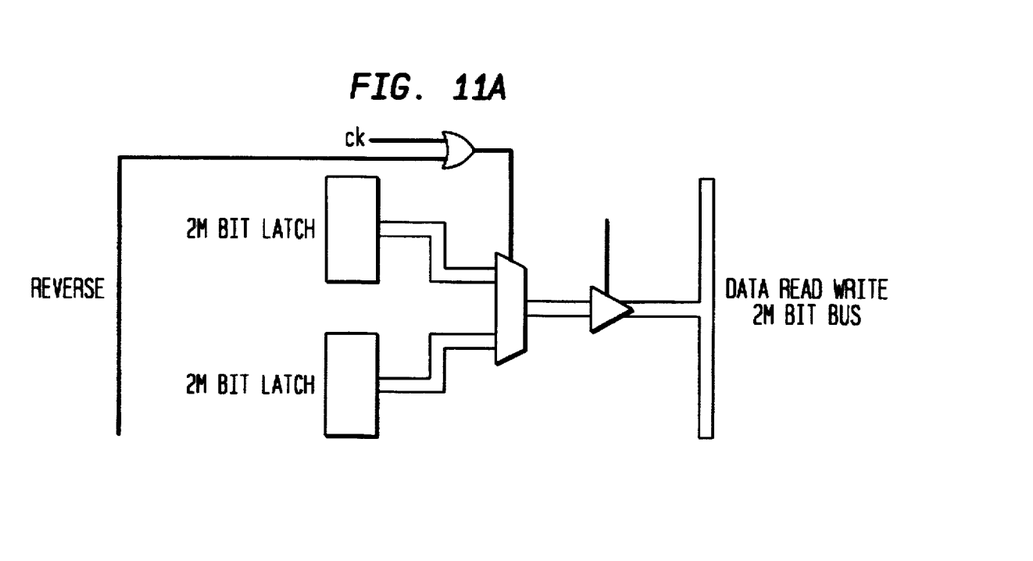
FIGS. 11a and 11b show embodiments of circuitry to improve misaligned read access performance.
Figure 11B:
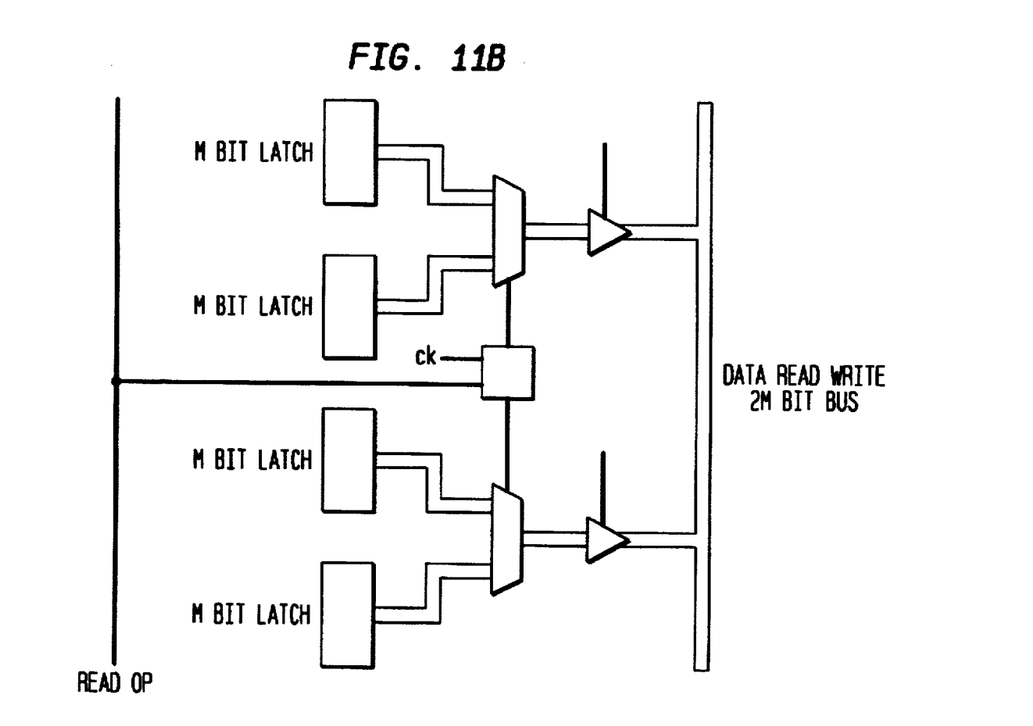
Figure 12A:
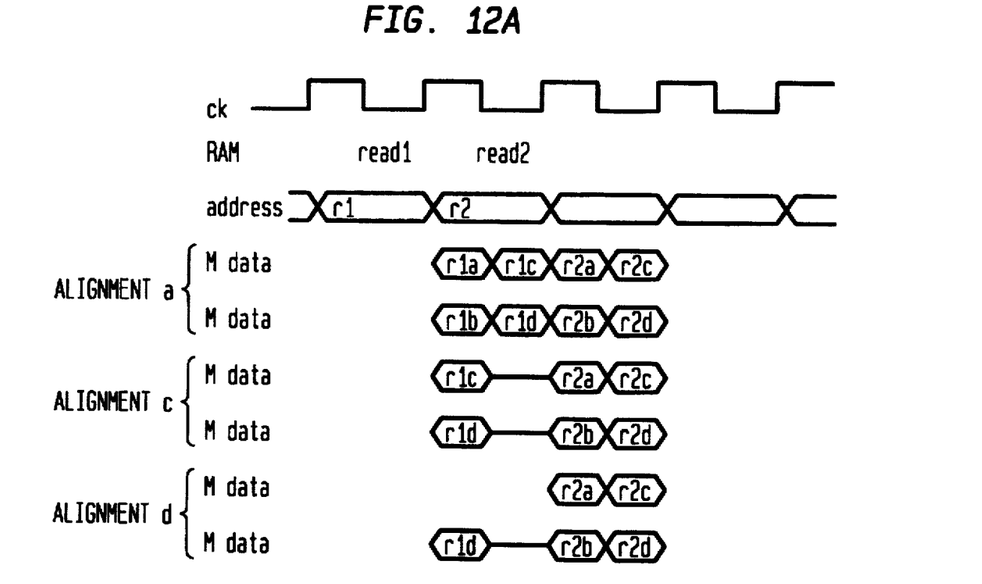
FIGS. 12a and 12b show the timing for the corresponding circuits of FIGS. 11a and 11b.
Figure 12B:
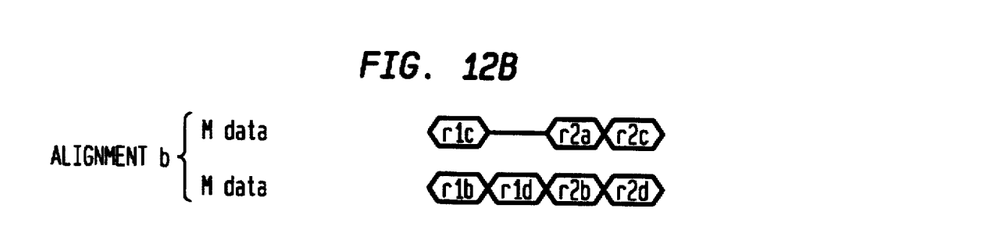

In a further enhancement to the present invention, it is shown how to improve the misaligned read access time performance. Referring to FIGS. 11a and 11b there are shown two variations of circuitry to improve the misaligned read access time performance. Referring to FIG. 11a there is shown an embodiment in which a signal named "reverse", driven by the Core 22 can tell the RAM 24 to reverse the phase order in which it drives a, b or c, d onto the combined bi-directional read write data bus. FIG. 12a shows the corresponding timing that goes with this FIG. 11a. In this scheme, two words can be satisfied in the first phase for both alignments a and c and one word can be satisfied in the first phase for all four alignments. Referring to FIG. 11b there is shown a more complicated alternative embodiment where a narrow bus named "read op" passes a command to logic in the RAM 24 which allows for one more trick where in the first phase words c and b can be written, allowing a two word access in one phase also to alignment b. The corresponding timing for FIG. 11b is shown in FIG. 12b. The improvements described to reduce misaligned read access time are also applicable to read only memories (ROMs).

The vector to vector operation depicted in FIG. 9 requires a system whereby the data to be written is transmitted in advance and held in write latches in the RAM 24. There are cases where the Core 22 has data to write to the RAM 24 but there is no conflict for the combined bi-directional read write data bus because no read has been performed. In a further enhancement to the present invention, it is shown how to speed up writing in this case. Table 2 indicates that two more commands have been added to the set that can be driven by the Core 22 on the write hold bus: pass1 and pass2.

TABLE 2

| Write Hold Command |
| --- |
| hold |
| catch1 |
| catch2 |
| catch3 |
| catch4 |
| pass1 |
| pass2 |

Figure 13:
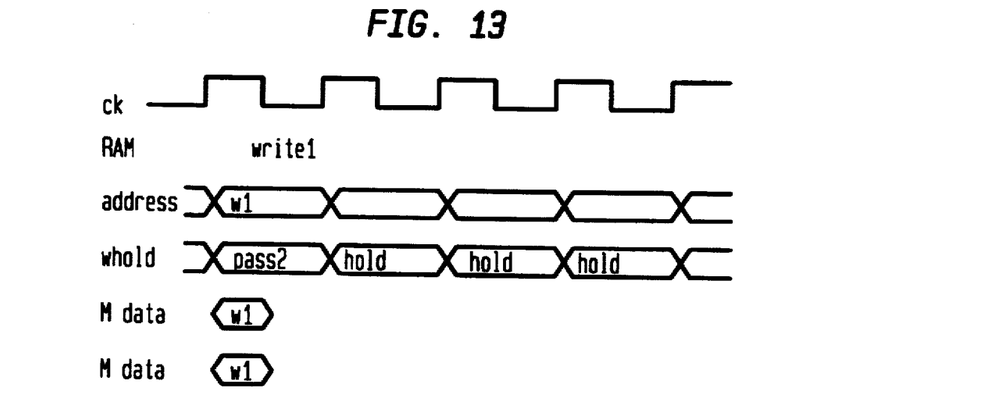
FIG. 13 shows improved timing for writing two words when there is no combined bi-directional read write data bus conflict.

These commands tell the memory that there are one or two words respectively being transmitted together with the address that should be written directly to the RAM array and not held for a subsequent cycle. Referring to FIG. 13 there is shown the improved timing for writing two words to the RAM array when there is no combined bi-directional read write data bus conflict.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure as well as specific boolean types of logic may be varied substantially without departing from the spirit of the invention and the exclusive use of all modifications which come within the scope of the appended claim is reserved.

What is claimed:

1. An integrated circuit for improved efficiency of internal data transfer comprising:
    a processor core having a buffer memory;
    a random access memory having a read and write cycle time of a one clock cycle, said random access memory comprising a memory array with a predetermined word width and a data latch coupled to said memory array;
    a bi-directional data bus coupling said processor core to said random access memory, said bidirectional data bus having a data width which is a multiple of at least one times said predetermined word width;
    a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and
    a control bus, said control bus indicating a number of words of data that said random access memory shall latch before writing to said memory array, wherein a non-aligned vector of multiple words is written in said clock cycle.

2. The integrated circuit as recited in claim 1 wherein said data width of said bi-directional data bus is a multiple of two times said predetermined word width.

3. The integrated circuit as recited in claim 2 wherein said memory array comprises read only memory.

4. The integrated circuit as recited in claim 1 wherein said data width of said bi-directional data bus is equal to said predetermined word width.

5. The integrated circuit as recited in claim 4 further comprising a multiplexer coupled to said data latch and an additional data latch said multiplexer is responsive to a control means to select between said data latch and said additional data latch, wherein one word of data is transferred in half of said clock cycle.

6. The integrated circuit as recited in claim 1 wherein said data width of said bi-directional data bus is a multiple of at least two times said predetermined word width.

7. An integrated circuit for improved efficiency of internal data transfer comprising:
  a processor core having a buffer memory;
  a random access memory having a read and write cycle time of a one clock cycle, said random access memory comprising a memory array with a predetermined word width and a data latch coupled to said memory array;
  a bi-directional data bus coupling said processor core to said random access memory, said bi-directional data bus having a data width which is a multiple of at least one times said predetermined word width;
  a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and,
  a reverse signal means for earlier read access.

8. The integrated circuit as recited in claim 5 further comprising a read operation control means for earlier read access.

9. An integrated circuit for improved efficiency of internal data transfer comprising:
  a processor core having a buffer memory;
  a random access memory having a read and write cycle time of a one clock cycle, said random access memory comprising a memory array with a predetermined word width and a data latch coupled to said memory array;
  a bi-directional data bus coupling said processor core to said random access memory, said bi-directional data bus having a data width which is a multiple of at least one times said predetermined word width;
  a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and,
  a pass means for indicating a lack of a bus conflict.

10. An integrated circuit digital signal processor having improved efficiency of internal data transfer comprising:
  a programmable processor core having a buffer memory;
  an on chip random access memory having a read and write cycle time of a one clock cycle, said on chip random access memory comprising a memory array with a predetermined word width and a data latch coupled to said memory array;
  a bi-directional read write data bus coupling said programmable processor core to said random access memory, said bi-directional read write data bus having a data width which is a multiple of at least one times said predetermined word width;
  a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and,
  a control bus, said control bus indicating a number of words of data that said random access memory shall latch before writing to said memory array, wherein a non-aligned vector of multiple words is written in said clock cycle.

11. The integrated circuit as recited in claim 10 wherein said data width of said bi-directional data bus is a multiple of two times said predetermined word width.

12. The integrated circuit as recited in claim 11 wherein said memory array comprises read only memory.

13. The integrated circuit as recited in claim 10 wherein said data width of said bi-directional data bus is equal to said predetermined word width.

14. The integrated circuit as recited in claim 13 further comprising a multiplexer coupled to said data latch and an additional data latch, said multiplexer is responsive to a control means to select between said data latch and said additional data latch, wherein one word of data is transferred in half of said clock cycle.

15. The integrated circuit as recited in claim 10 wherein said data width of said bi-directional data bus is a multiple of at least two times said predetermined word width.

16. An integrated circuit digital signal processor having improved efficiency of internal data transfer comprising:
  a programmable processor core having a buffer memory;
  an on chip random access memory having a read and write cycle time of a one clock cycle, said on chip random access memory comprising a memory array with a predetermined word width and a data latch coupled to said memory array;
  a bi-directional read write data bus coupling said programmable processor core to said random access memory, said bi-directional read write data bus having a data width which is a multiple of at least one times said predetermined word width;
  a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and,
  a reverse signal means for earlier read access.

17. The integrated circuit as recited in claim 14 further comprising a read operation control means for earlier read access.

18. An integrated circuit digital signal processor having improved efficiency of internal data transfer comprising:
  a programmable processor core having a buffer memory;
  an on chip random access memory having a read and write cycle time of a one clock cycle, said on chip random access memory comprising a memory array with a predetermined word width and a data latch coupled to said memory array;
  a bi-directional read write data bus coupling said programmable processor core to said random access memory, said bi-directional read write data bus having a data width which is a multiple of at least one times said predetermined word width;
  a signal circuit coupled to said data latch wherein said data latch is responsive to said signal circuit to latch data from said bi-directional data bus prior to writing said data to said memory array, wherein alternately reading two consecutive data words and writing two consecutive words occurs on an average in said clock cycle; and,
  a pass means for indicating a lack of a bus conflict.

* * * * *